(12) United States Patent
Hwan (10) Patent No.: US 7,943,426 B2
(45) Date of Patent: May 17, 2011

(54) PACKAGE STRUCTURE FOR INTEGRATED CIRCUIT DEVICE AND METHOD OF THE SAME

(75) Inventor: Lu-Chen Hwan, Taipei (TW)

(73) Assignee: Mutual-Pak Technology Co., Ltd., Xinzhuang (TW)

( * ) Notice: Subject to any disclaimer, the term of this patent is extended or adjusted under 35 U.S.C. 154(b) by 224 days.

(21) Appl. No.: 12/421,512

(22) Filed: Apr. 9, 2009

(65) Prior Publication Data

US 2009/0267230 A1    Oct. 29, 2009

(30) Foreign Application Priority Data

Apr. 24, 2008   (TW) ................................ 97114993 A (51) Int. Cl.
*H01L 21/44*   (2006.01)
*H01L 21/48*   (2006.01)
*H01L 21/50*   (2006.01)

(52) U.S. Cl. .. 438/113; 438/460; 438/462; 257/E21.499

(58) Field of Classification Search .................... 438/113
See application file for complete search history.

(56) References Cited

U.S. PATENT DOCUMENTS

2006/0286718 A1 *   12/2006   Ozaki ........................... 438/113

FOREIGN PATENT DOCUMENTS

CN           2681355        2/2005

* cited by examiner

*Primary Examiner* — Thien F Tran
(74) *Attorney, Agent, or Firm* — Snell & Wilmer L.L.P.

(57) ABSTRACT

The present invention discloses a package structure for an integrated circuit device and method for manufacturing the same. The method includes providing a wafer with multiple integrated circuit devices; providing an extendable substrate having a first surface supporting the wafer; forming multiple anti-elongation layers on a second surface of the extendable substrate, the second surface being opposite to the first surface; forming multiple recesses in the wafer for separating the integrated circuit devices from each other; elongating the extendable substrate to enlarge the multiple recesses; and forming an insulating layer to fill the recesses and cover multiple integrated circuit devices.

18 Claims, 9 Drawing Sheets

PACKAGE STRUCTURE FOR INTEGRATED CIRCUIT DEVICE AND METHOD OF THE SAME

CROSS-REFERENCE TO RELATED APPLICATIONS

This application claims priority to Taiwan Patent Application No. 97114993 entitled "PACKAGE STRUCTURE FOR INTEGRATED CIRCUIT DEVICE AND METHOD OF THE SAME," filed on Apr. 24, 2008, which is incorporated herein by reference and assigned to the assignee herein.

FIELD OF INVENTION

This invention relates to a package structure for intergraded circuit devices and a method of the same, and more particularly, relates to a wafer level package structure for intergraded circuit devices and a method of the same.

BACKGROUND OF THE INVENTION

In a conventional wafer level package process, package structures are directly formed on a wafer which has circuits formed thereon by rerouting the wafer, coating the wafer with dielectric material, and attaching solder balls to the wafer. The conventional wafer level package process is only suitable for the circuits with larger size and less input/output devices. In detail, because the solder balls need to connect with contact areas of the circuit board, the pitch space of the circuit should be larger than 0.25 mm based on current design rule. Therefore, the conventional solder ball process is not suitable for the small-size integrated circuit devices which are incapable of providing enough pitch space.

The post-packaging process has been used to increase the available contact areas of the integrated circuit devices. For example, the packaged integrated circuit devices are cut into individual dies (chips) and then moved to a larger substrate. Next, the post-packaging process is performed on the larger substrate to form additional contact lines for the integrated circuit devices, whereby the contact areas of the integrated circuit devices can be increased. This conventional post-packaging process suffers from high process complexity and cost, and therefore, it is desired to have a novel package structure for intergraded circuit devices and a method of the same to resolve the above-mentioned problems.

SUMMARY OF THE INVENTION

In light of the foregoing, it is one object of the present invention to provide a wafer level package structure suitable for the integrated circuit devices with small size.

One feature of the present invention is using an extendable substrate to expand the space between two adjacent chips on a wafer before packaging, instead of the complex process of moving the chips to another larger substrate.

According to one embodiment, the present invention provides a method for packaging a plurality of integrated circuit device, including the following steps: providing a wafer with the plurality of integrated circuit devices; providing an extendable substrate having a first surface and a second surface, the second surface being opposite to the first surface, the first surface supporting the wafer; cutting the wafer to form a plurality of recesses for separating the integrated circuit devices from each other; elongating the extendable substrate to enlarge the plurality of recesses; and forming an insulating layer to fill the recesses and cover the plurality of integrated circuit devices.

Another feature of the present invention is to control the extended position of the extendable substrate by attaching anti-elongation layers on the extendable substrate.

According to another embodiment, the present invention provides a method for packaging a plurality of integrated circuit devices, including the following steps: providing a wafer with the plurality of integrated circuit devices; providing an extendable substrate having a first surface and a second surface, the second surface being opposite to the first surface, the first surface supporting the wafer; forming a plurality of anti-elongation layers on the second surface; cutting the wafer to form a plurality of recesses for separating the integrated circuit devices from each other; elongating the extendable substrate to enlarge the plurality of recesses; and forming an insulating layer to fill the recesses and cover the plurality of integrated circuit devices.

Still another feature of the present invention is to form at least one through hole and a surface conductive layer on the packaged integrated circuit devices. The through hole and the surface conductive layer allow the packaged integrated circuit devices to have external contacts in different directions, whereby the available areas of the integrated circuit devices for external connection can be increased.

According to still another embodiment, the present invention provides a method for packaging a plurality of integrated circuit devices, including the following steps: providing a wafer with the plurality of integrated circuit devices; forming a plurality of conductive bumps on the plurality of integrated circuit devices; providing an extendable substrate having a first surface and a second surface, the second surface being opposite to the first surface, the first surface supporting the wafer; forming a plurality of anti-elongation layers on the second surface; cutting the wafer to form a plurality of recesses for separating the integrated circuit devices from each other; elongating the extendable substrate to enlarge the plurality of recesses; forming an insulating layer to fill the recesses and cover the plurality of integrated circuit devices; forming a plurality of through holes passing through the insulating layer and the extendable substrate; forming a surface conductive layer covering inner walls of the through holes, the surface conductive layer extending outward to cover the plurality of conductive bumps and the plurality of the anti-elongation layers; and removing a part of the surface conductive layer to form a first circuit connected to top surfaces of the plurality of conductive bumps and a second circuit connected to top surfaces of the plurality of anti-elongation layers.

Other aspects of the present invention would be stated and easily understood through the following description or the embodiments of the present invention. The aspects of the present invention would be appreciated and implemented by the elements and their combinations pointed out in the appended claims. It should be understood that the above summary of the invention and the following detailed description are only illustrative but not to limit the present invention.

BRIEF DESCRIPTION OF THE DRAWINGS

The drawings are employed to illustrate the embodiments and the principles of the present invention in conjunction with the description. However, it should be understood that the present invention is not limited to the shown configurations and elements, in which.

DETAILED DESCRIPTION OF THE PREFERRED EMBODIMENTS

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as not to unnecessarily obscure the features of the invention.

FIG. 1 to FIG. 12 are cross-sectional views illustrating a method of forming a package structure in accordance with an embodiment of the present invention. First, referring to FIG. 1, a wafer 100 is provided. The wafer 100 has a plurality of the integrated circuit devices 102, input/output contacts 104 formed on the integrated circuit devices 102, and a protective layer 110. The integrated circuit devices 102 can be a diode (such as a light-emitting diode, a photodiode, a laser diode, or a rectifier diode) or a transistor (such as MOS, CMOS, etc.). Since the plurality of the integrated circuit devices 102 are not separated from each other yet, the dotted lines are drawn in FIG. 1 to clearly indicate the respective location of each of the integrated circuit devices 102. The input/output contacts 104 can be made of aluminum or any other suitable conductive material. The protective layer 110 can be made of silicon oxynitride (SiNO), or any other material capable of protecting the integrated circuit devices 102.

Figure 1:
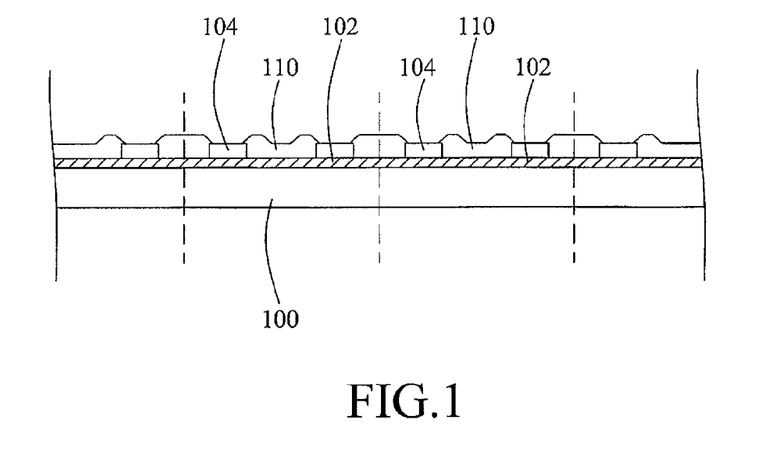
FIG. 1 to FIG. 12 are cross-sectional views illustrating a manufacturing process in accordance with an embodiment of the present invention.
Figure 2:
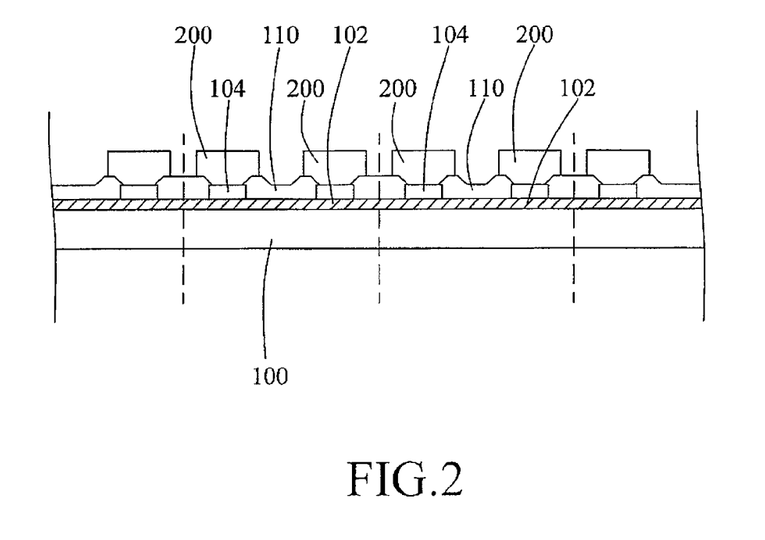

Referring to FIG. 2, a plurality of conductive bumps 200 are formed on the input/output contacts 104 by, for example, a stencil printing process. The stencil printing process is referred as a method using a conventional printing machine with a patterned meshed screen (preferably with a steel plate) as a mask. By pressing conductive material through openings on the meshed screen, the printing machine can print the conductive bumps 200 on the surfaces of the input/output contacts 104. Except for the stencil printing process, other processes, such as electro plating, electroless plating, sputtering, or deposition and photolithography can be adapted to form the conductive bumps 200. For example, the conductive material can be a metal material, such as Cu, Ag, or Sn, a non-metal material, such as conductive polymer, or the combination thereof. The conductive material also can include polymer adhesives, such as epoxy resins.

Figure 3:
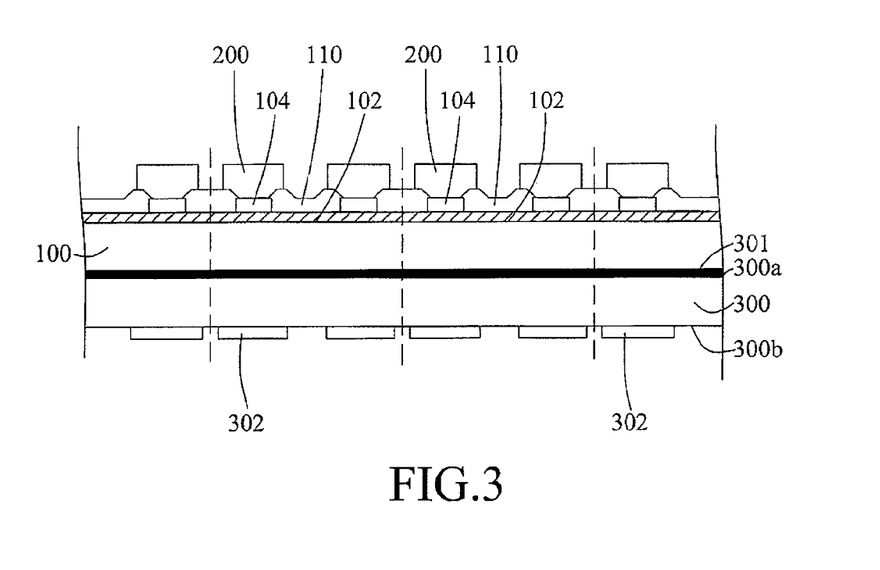

Referring to FIG. 3, an extendable substrate 300 is provided. The extendable substrate 300 has a first surface 300a and a second surface 300b opposite to the first surface 300a. The first surface 300a supports the wafer 100. An adhesives layer 301 can be coated on the first surface 300a of the extendable substrate 300 to connect the wafer 100 with the extendable substrate 300. The extendable substrate 300 can be any suitable substrate with support function, such as flexible substrate, rigid substrate, or rigid-flexible substrate. The extendable substrate 300 can be made of expandable elastic material, such as silicon robber, polyimide, polyethylene, polypropylene, which can further be blended with other suitable material, such as silicate, etc. The adhesive layer 301 can be made of acrylic esters, epoxy, polyurethanes or silicon robber.

Also referring to FIG. 3, a plurality of anti-elongation layers 302 can be optionally formed on the second surface 300b of the extendable substrate 300. The anti-elongation layers 302 can be made of any material which can be attached on the extendable substrate 300, preferably of the material having higher tension and lower elasticity than the extendable substrate 300. One function of the anti-elongation layers 302 is to control the extended position of the extendable substrate 300. When the extendable substrate 300 is elongated, the part not covered by the anti-elongation layers 302 can be extended relatively easily. Each part of the anti-elongation layers 302 corresponds to each of input/output contacts 104 respectively, and the anti-elongation layers 302 can be made of the conductive material, such as metal (for example, Cu, Al, etc.) or conductive polymer, but not limited thereto. Except for resisting elongation, the conductive anti-elongation layers 302 can be used to form a conductive circuit. In addition, the extendable substrate 300 can be patterned to embed the anti-elongation layers 302 within the extendable substrate 300, whereby the extended position of the extendable substrate 300 can be controlled by the same structure and, in the meantime, the whole thickness can be reduced.

Figure 4:
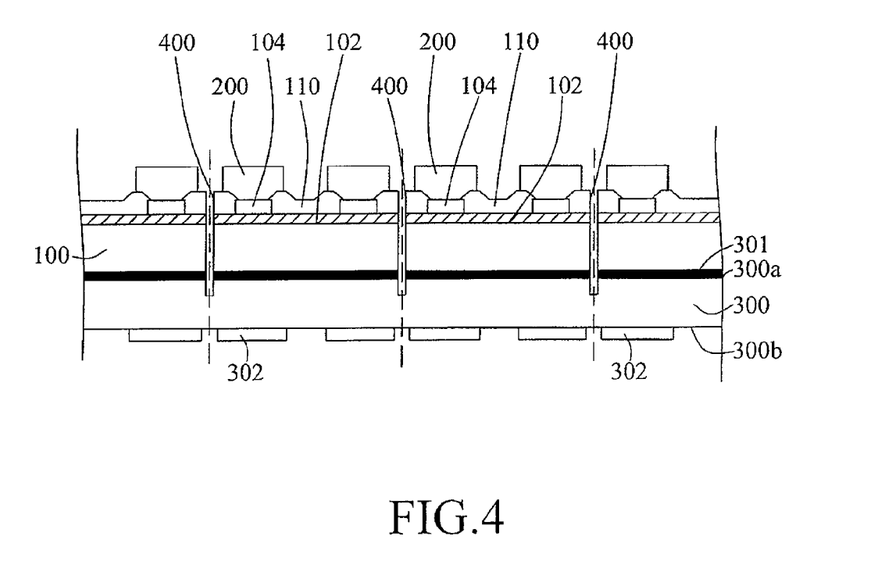

Referring to FIG. 4, a plurality of recesses 400 are formed on the wafer 100 along the dotted line for separating the integrated circuit devices 102 from each other. The recesses 400 can penetrate into the wafer 100, the adhesive layer 301, and a part of the extendable substrate 300, but not pass through the extendable substrate 300. In other words, the integrated circuit devices 102 are connected with each other by the extendable substrate 300 in this process stage. The recesses 400 can be formed by cutting blade, laser cutting, dry etching, wet etching, or other suitable processes.

Figure 5:
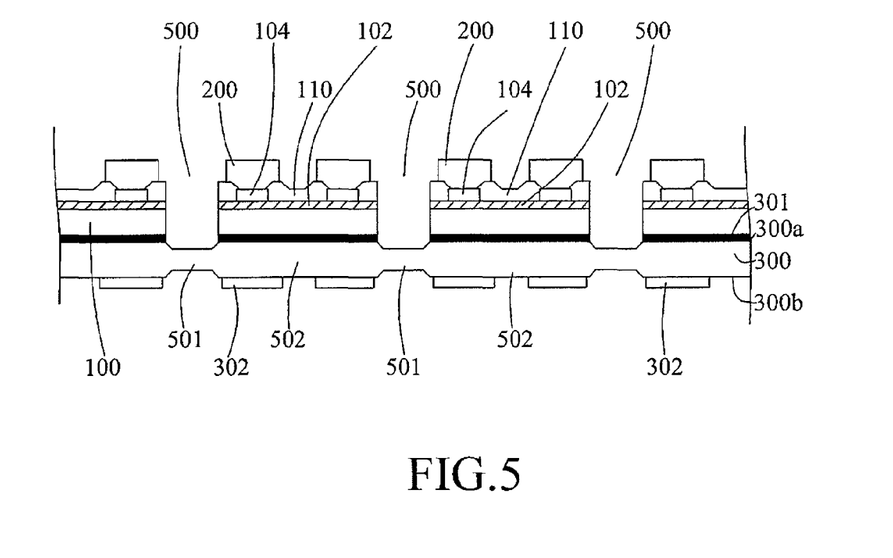

Referring to FIG. 5, the extendable substrate 300 is elongated to enlarge each of the plurality of recesses 400, for increasing space between each two adjacent integrated circuit devices 102. The enlarged recesses are denoted as 500. It should be noted that the extendable substrate 300 includes a first part 501 corresponding to the recesses 500 and a second part 502 not corresponding to the recesses 500. With the integrated circuit devices 102 disposed above, elongation of the second part 502 is smaller than of the first part 501 when the extendable substrate 300 is elongated. Furthermore, the anti-elongation layers 302 covers the second part 502. Because the second part 502 is interposed between the integrated circuit device 102 and the anti-elongation layers 302, it can be further restrained from extending outward when the extendable substrate 300 is elongated.

Figure 6:
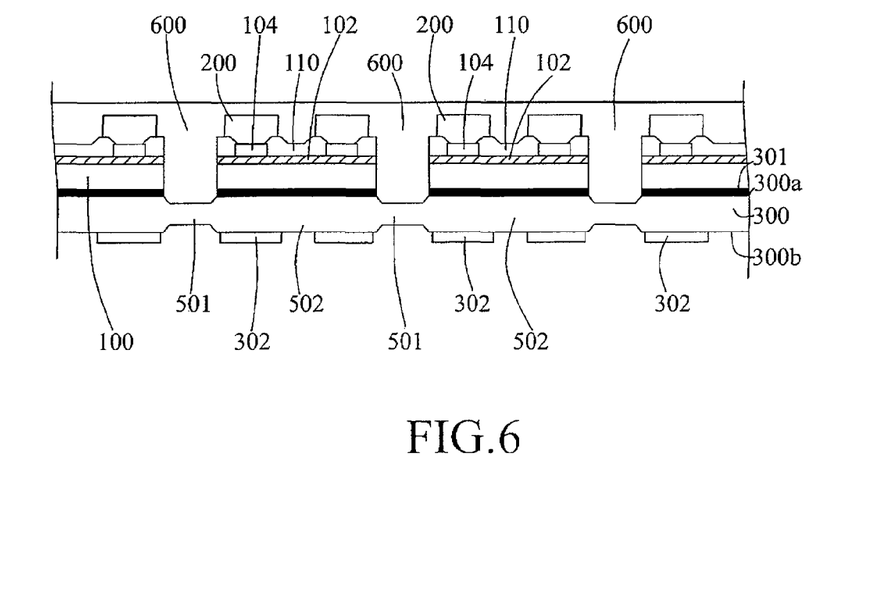
Figure 7:
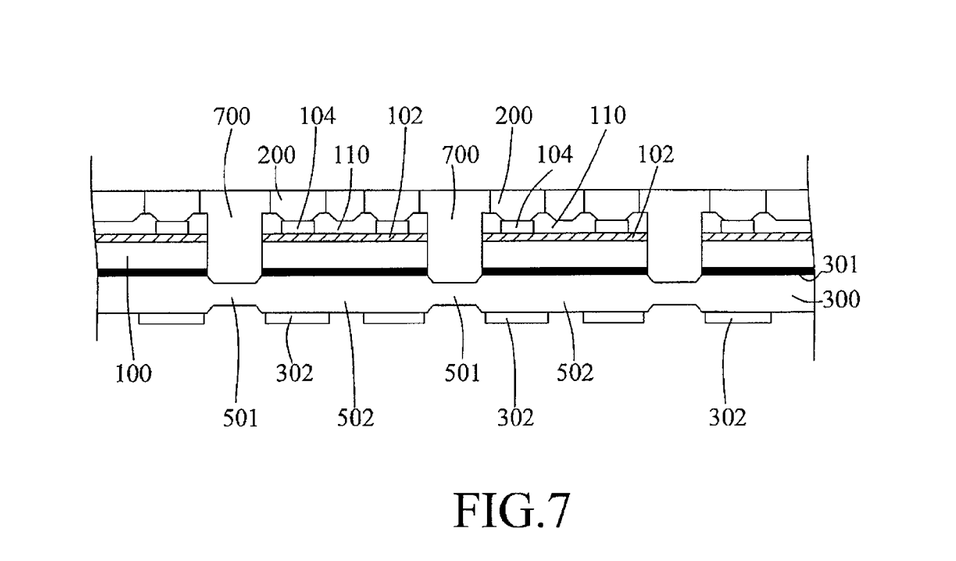

Referring to FIG. 6, an insulating layer 600 is formed above the extendable substrate 300 to fill the recesses 500 and cover the plurality of integrated circuit devices 102, the conductive bumps 200, and the protective layer 110. The insulating layer 600 can be made of epoxy, polyimide, benzocycle butane, liquid crystal polymer, the combinations thereof, or any other suitable package material. If the integrated circuit devices 102 are optical devices, such as light-emitting diode, photodiode, CMOS sensor, etc., the insulating layer 600 is preferably made of transparent material. Next, referring to FIG. 7, a part of the insulating layer 600 is removed to expose top surfaces of the plurality of conductive bumps 200. The step of removing a part of the insulating layer 600 can be performed by, for example, the known chemical mechanical polishing process, and the insulating layer is denoted as 700 after this removing step.

Figure 8:
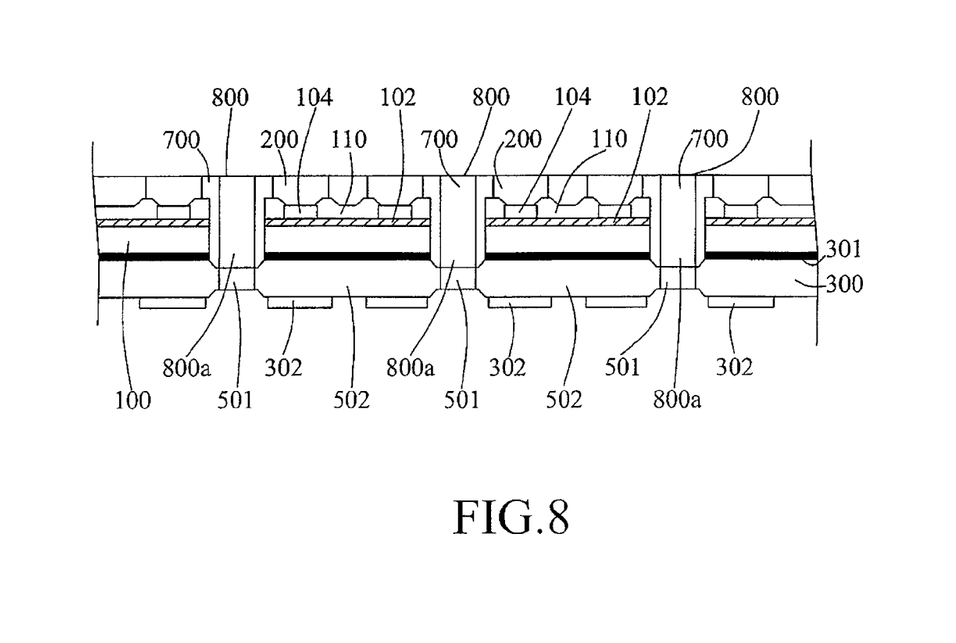

Referring to FIG. 8, a plurality of through holes 800 passing through the insulating layer 700 and the extendable substrate 300 are formed at the positions corresponding to the recesses 500. The plurality of through holes 800 preferably surround each of the integrated circuit devices 102. The through holes 800 can be formed by using the conventional mechanical drilling process or laser drilling process. As shown in FIG. 8, each of the through holes 800 has an inner wall 800a which exposes the insulating layer 700 and the first part 501 of the extendable substrate 300.

Figure 9:
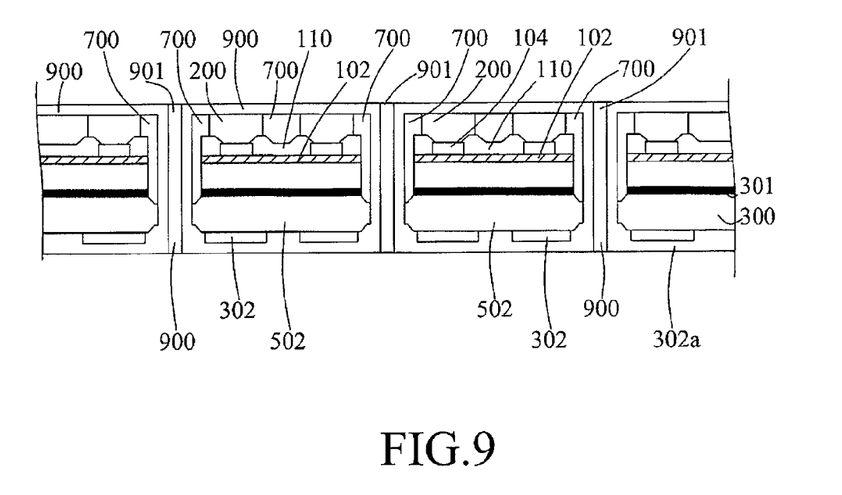

Referring to FIG. 9, a surface conductive layer 900 is formed to cover the whole structure shown in FIG. 8. In detail, the surface conductive layer 900 covers not only the insulating layer 700 and the extendable substrate 300, including the inner walls 800a of the through holes 800, but also the anti-elongation layers 302 and the plurality of the conductive bumps 200. The surface conductive layer 900 can be formed by sputtering, chemical vapor deposition, printing, electro plating, electroless plating, or other suitable manufacturing processes. The material of the surface conductive layer 900 may include metal (such as Cu, Al, or the like) or conductive polymer. After forming the surface conductive layer 900, conductive holes 901 electrically connecting with the conductive bumps 200 can be formed. It should be noted that the surface conductive layer 900 can either fill the through holes 800, or only cover the inner walls 800a of the through holes 800 to form the conductive holes 901 with hollow structure. An example of the latter is illustrated in this embodiment.

Figure 10:
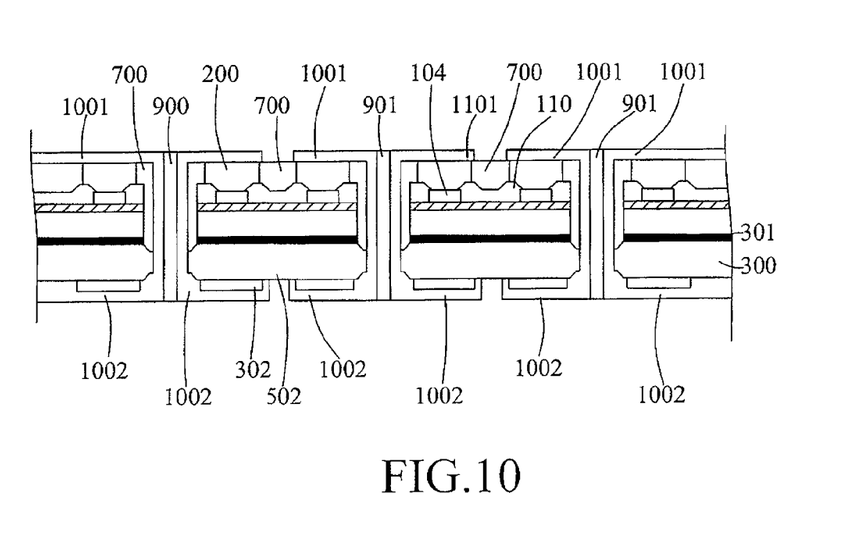

Referring to FIG. 10, the surface conductive layer 900 is patterned, i.e. a part of the surface conductive layer 900 is removed by the conventional photolithography and etching process, to expose the underlying insulating layer 700. By patterning the surface conductive layer 900, a first circuit 1001 connecting with top surfaces of the plurality of the conductive bumps 200 is formed, and a second circuit 1002 connecting with top surfaces of the plurality of the anti-elongation layers 302 is also formed.

Figure 11:
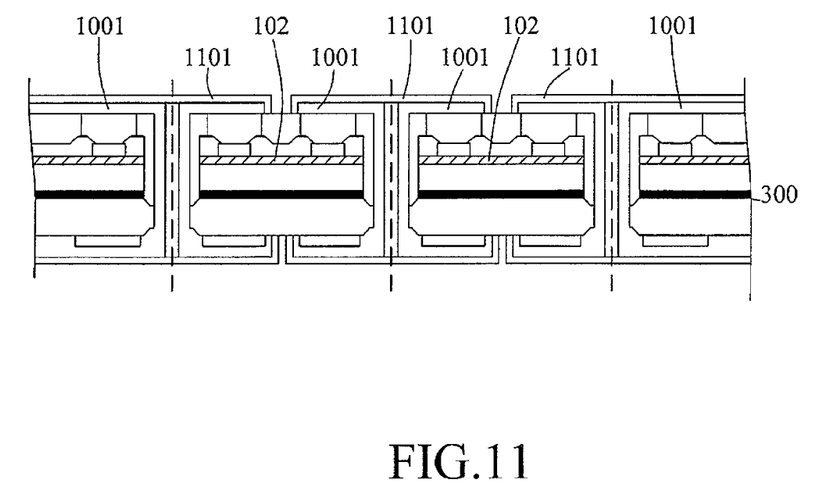
Figure 12:
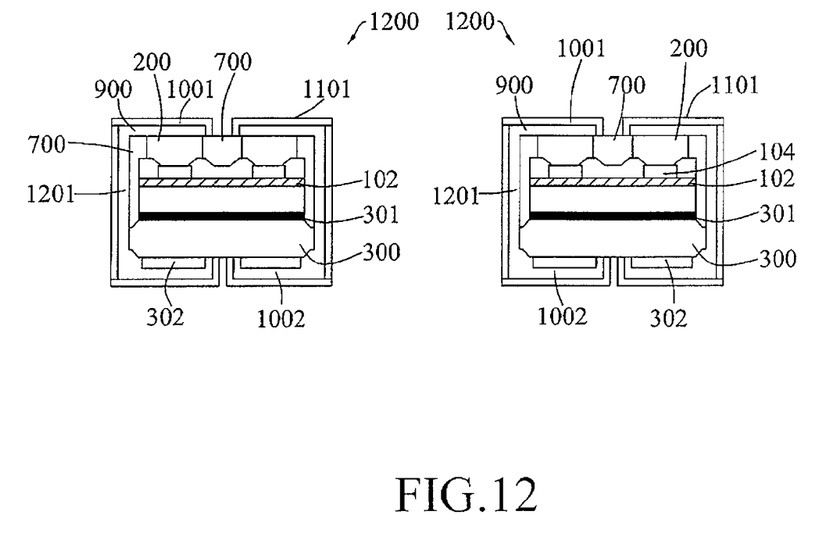

Referring to FIGS. 11 and 12, after patterning the surface conductive layer 900, an optional step of plating a conductive protective layer 1101 on the surface of the surface conductive layer 900 may be performed. The material for the conductive protective layer 1101 can be Au or Ni. Furthermore, a solder resist (not shown) can be optionally coated on the conductive protective layer 1101. Then, the plurality of the integrated circuit devices 102, which have been packaged and formed with extended circuit for external connection, can be separated from each other by cutting along the dotted lines shown in FIG. 11 to form a plurality of granular-shaped chips 1200. As shown in FIG. 12 (only two chips 1200 are shown for illustration), the packaged chips 1200 includes: the integrated circuit devices 102; the elongated extendable substrate 300 having the first surface 300a and the second surface 300b being opposite to the first surface 300a, the first surface 300a supporting the integrated circuit devices 102; the anti-elongation layers 302 disposed on the second surface 300b; and the insulating layer 700 covering the integrated circuit devices 102. The packaged chips 1200 further include: the conductive bumps 200 embedded in the insulating layer 700 for electrically connecting to the integrated circuit devices 102; the adhesive layer 301 connecting the elongated extendable substrate 300 and the integrated circuit devices 102; the patterned surface conductive layer 900 covering the insulating layer 700, the conductive bumps 200, and the anti-elongation layers 302; and the conductive protective layer 1101 covering the patterned surface conductive layer 900. In detail, the patterned surface conductive layer 900 includes: the first circuit 1001 covering the conductive bumps 200; the second circuit 1002 covering the anti-elongation layers 302; and the lateral conductive layer 1201 electrically connecting the first circuit 1101 and the second circuit 1102. The lateral conductive layer 1201 is part of the surface conductive layer 900 covering the through holes 800 before the cutting step. Therefore, the patterned surface conductive layer 900 allows the integrated circuit devices 102 to have external contacts in different directions, whereby the available areas of the integrated circuit devices 102 for external connection can be increased.

Figure 13:
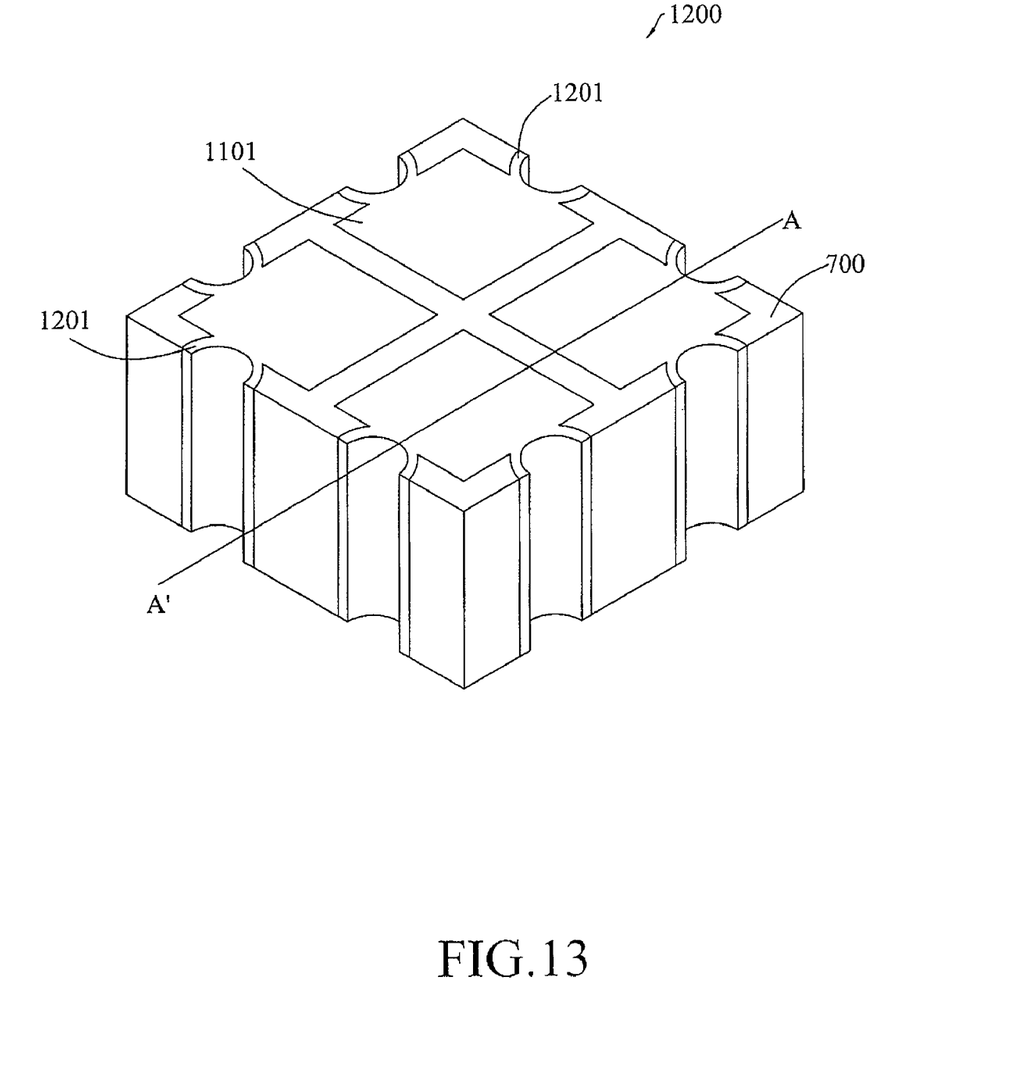
FIG. 13 shows a perspective view of the packaged chip in accordance with the first embodiment of the present invention.

FIG. 13 shows a perspective view of the packaged chip 1200 formed by the method of the first embodiment of the present invention. The cross section profile taken along the dotted line is shown in FIG. 12. As shown in FIG. 13, the packaged chip 1200 has eight lateral conductive layers 1201, and each lateral conductive layer 1201 has a shape of a half-cylinder.

Figure 14:
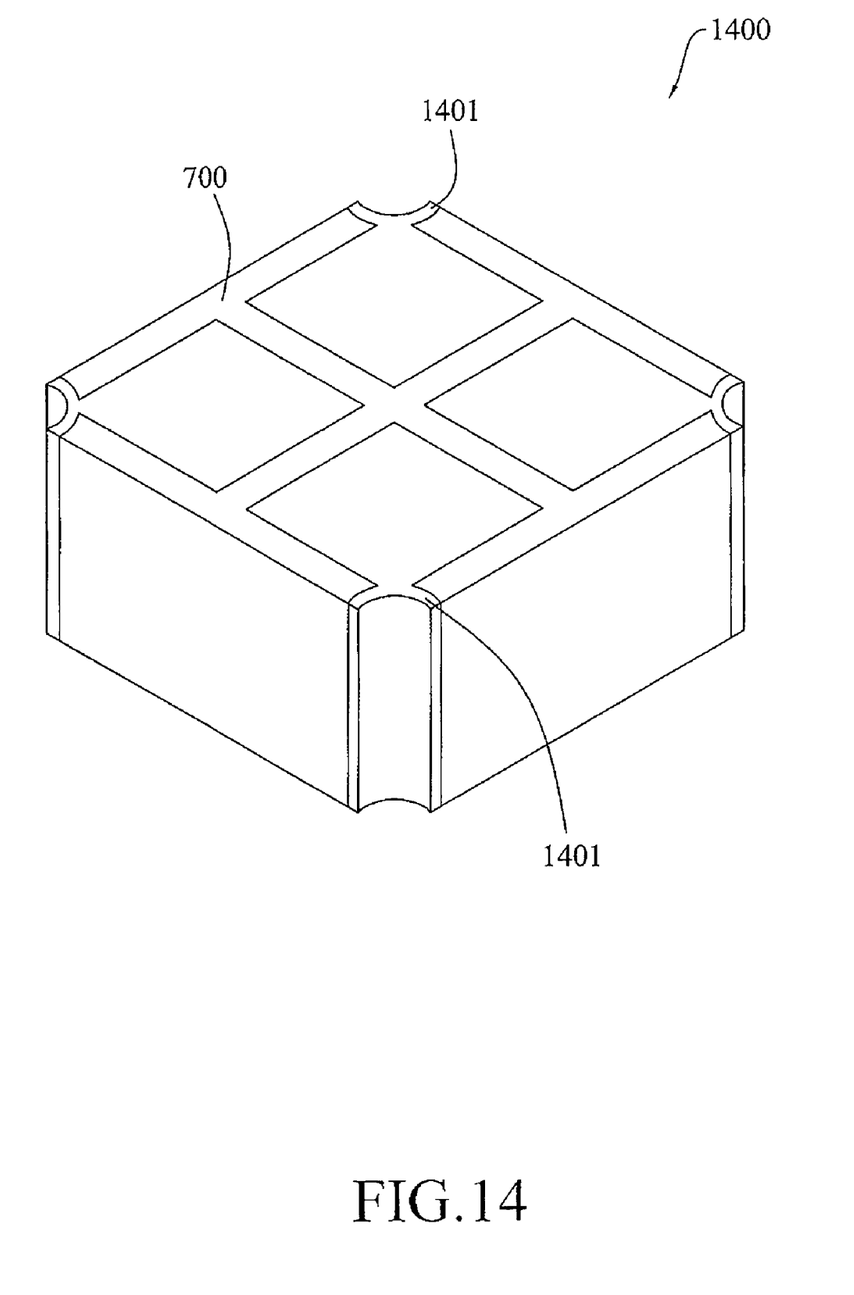
FIG. 14 shows a perspective view of the packaged chip in accordance with the second embodiment of the present invention.

FIG. 14 shows a perspective view of the packaged chip 1400 in accordance with the second embodiment of the present invention. The difference between the methods of the second and the first embodiments is the location and the shape of the lateral conductive layer 1401. As shown in FIG. 14, the packaged chip 1400 has four lateral conductive layers 1401 disposed at four corners of the packaged chip 1400 respectively, and each lateral conductive layer 1401 has a shape of a quarter-cylinder.

Figure 15:
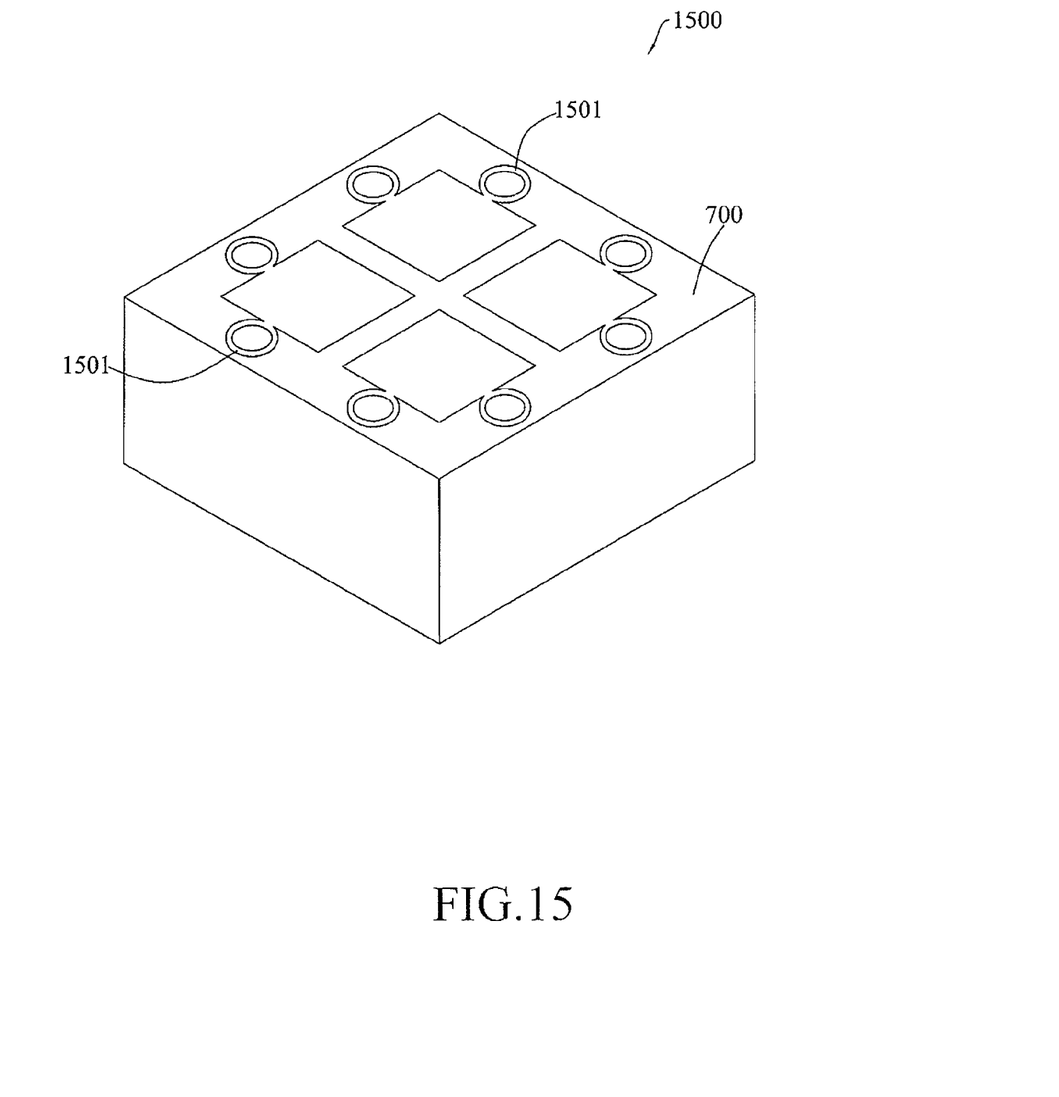
FIG. 15 shows a perspective view of the packaged chip in accordance with the third embodiment of the present invention.

FIG. 15 shows a perspective view of the packaged chip 1500 in accordance with the third embodiment of the present invention. The difference between the methods of the third and the first embodiments is the shape of the lateral conductive layer 1501. As shown in FIG. 15, the packaged chip 1400 has eight lateral conductive layers 1501, and each lateral conductive layer 1501 has a shape of a cylinder.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

I claim:

1. A method for packaging a plurality of integrated circuit devices, the method comprising:
   providing a wafer with the plurality of integrated circuit devices;
   providing an extendable substrate having a first surface and a second surface, the second surface being opposite to the first surface, the first surface supporting the wafer;
   forming a plurality of anti-elongation layers on the second surface;
   forming a plurality of recesses in the wafer for separating the integrated circuit devices from each other;
   elongating the extendable substrate to enlarge the plurality of recesses; and
   forming an insulating layer to fill the recesses and cover the plurality of integrated circuit devices.

2. The method according to claim 1, wherein the extendable substrate comprises a first part corresponding to the plurality of recesses and a second part not corresponding to the plurality of recesses, and elongation of the first part is larger than of the second part when performing the step of elongating the extendable substrate.

3. The method according to claim 2, wherein the plurality of anti-elongation layers cover the second part to restrain the second part from extending outward when performing the step of elongating the extendable substrate.

4. The method according to claim 1, wherein after the step of elongating the extendable substrate, the method further comprises:
forming a plurality of through holes passing through the insulating layer and the extendable substrate.

5. The method according to claim 4, further comprising:
forming a plurality of conductive bumps electrically connected to the plurality of integrated circuit devices; and
forming a surface conductive layer covering the plurality of through holes and forming a second circuit on top surfaces of the plurality of anti-elongation layers.

6. The method according to claim 4, wherein the step of forming the plurality of through holes is performed by a mechanical drilling process or a laser drilling process.

7. The method according to claim 4, further comprising:
forming a plurality of conductive bumps electrically connected to the plurality of integrated circuit devices; and
forming a surface conductive layer covering the plurality of through holes and forming a first circuit on top surfaces of the plurality of conductive bumps.

8. The method according to claim 7, wherein the conductive bumps is made of a material selected from the group consisting of Cu, Ag, Sn, and conductive polymer.

9. The method according to claim 1, wherein the step of forming the insulating layer further comprising:
forming a plurality of conductive bumps electrically connected to the plurality of integrated circuit devices;
rendering the insulating layer to cover the plurality of conductive bumps; and
removing a part of the insulating layer to expose top surfaces of the plurality of the conductive bumps.

10. The method according to claim 1, further comprising a step of cutting the extendable substrate to separate the plurality of the integrated circuit devices from each other.

11. The method according to claim 1, further comprising an adhesive layer for connecting the wafer and the extendable substrate.

12. The method according to claim 11, wherein the adhesive layer is made of a material selected from the group consisting of acrylic esters, epoxy, polyurethanes, and silicon robber.

13. The method according to claim 1, wherein the plurality of anti-elongation layers are made of conductive material.

14. The method according to claim 1, further comprising:
forming a plurality of conductive bumps on the plurality of integrated circuit devices;
forming a plurality of through holes passing through the insulating layer and the extendable substrate;
forming a surface conductive layer covering inner walls of the through holes, the surface conductive layer extending outward to cover the plurality of conductive bumps and the plurality of the anti-elongation layers; and
removing a part of the surface conductive layer to form a first circuit connected to top surfaces of the plurality of conductive bumps and a second circuit connected to top surfaces of the plurality of anti-elongation layers.

15. The method according to claim 14, wherein the step of forming the first circuit and the second circuit is performed by using a photolithography process, a printing process, an electro plating process, or an electroless plating process.

16. The method according to claim 1, wherein the extendable substrate is made of a material selected from the group consisting of silicon robber, polyimide, polyethylene, and polypropylene.

17. The method according to claim 1, wherein the step of forming the plurality of recesses is performed by using a cutting blade, a laser cutting process, a dry etching process, or a wet etching process.

18. The method according to claim 1, wherein the insulating layer is made of a material selected from the group consisting of epoxy, polyimide, benzocycle butane, liquid crystal polymer, and the combinations thereof.

* * * * *